US006670840B1

(12) United States Patent
Kiani et al.

(10) Patent No.: US 6,670,840 B1
(45) Date of Patent: Dec. 30, 2003

(54) INPUT CLAMP CIRCUIT FOR 5V TOLERANT AND BACK-DRIVE PROTECTION OF I/O RECEIVERS USING CMOS PROCESS

(75) Inventors: Khusrow Kiani, Oakland, CA (US); Elroy M. Lucero, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/205,869

(22) Filed: Jul. 26, 2002

(51) Int. Cl.[7] ................................................. H03K 5/08
(52) U.S. Cl. ...................... 327/309; 327/312; 361/91.1; 361/111
(58) Field of Search ................................. 327/545, 546, 327/309, 312, 321; 365/201; 361/56, 91.1, 111, 118, 86

(56) References Cited

U.S. PATENT DOCUMENTS 5,835,427 A  * 11/1998  McClure ...................... 365/201
6,081,412 A  *  6/2000  Duncan et al. ................ 361/86
6,437,958 B1 *  8/2002  Duncan et al. ............. 361/91.1

* cited by examiner

*Primary Examiner*—My-Trang Nu Ton
*Assistant Examiner*—Hiep Nguyen
(74) *Attorney, Agent, or Firm*—Vollrath & Associates

(57) ABSTRACT

In a receiver input back-drive protection circuit and method, a pass gate is provided between the high pad voltage and the receiver input and a clamping circuit is provided, to present a reduced voltage to the receiver input during stress mode.

10 Claims, 5 Drawing Sheets

INPUT CLAMP CIRCUIT FOR 5V TOLERANT AND BACK-DRIVE PROTECTION OF I/O RECEIVERS USING CMOS PROCESS

FIELD OF THE INVENTION

The invention relates to a method and system for providing 5V tolerant and back-drive circuit protection for a receiver input interface.

BACKGROUND OF THE INVENTION

A typical integrated circuit device (IC) includes a core region 100, as illustrated in FIG. 1, and one or more functional elements or packages such as analog support/conversion circuitry 102. These are connected through an I/O interface 104 to pads 106 that allow the IC to be connected externally to other devices. The voltage levels vary for different portions of the IC, thus requiring special consideration to avoid exposing the various portions of the IC to excessive voltage levels. For instance, the core, I/O interface, and external circuitry to which the pads of the IC connect, typically will each support different voltages. Even within a typical CMOS core, voltages vary depending on the process used. For example, a 0.25 $\mu$m process supports voltage levels of the order of 2.5 V±10%; a 0.18 $\mu$m process supports voltage levels of the order of 1.8 V±10%; a 0.15 $\mu$m process supports voltage levels of the order of 1.5 V±10%, and a 0.13 $\mu$m process supports voltage levels of the order of 1.2 V±10%. In contrast, the I/O interface needs to support 3.3 V typically. For ease of understanding the input voltage levels to the core have been identified as VDD and VSS while those for the I/O interface are indicated as VDDIO and VSSIO. Furthermore, the pads may be connected to circuitry operating in the 5 V range. For example, where the IC drives a PCI bus, it is important that the IC can withstand the higher voltages of the system that it is supporting. In order to supply the higher voltage, a dual gate process involving the use of thick gate oxides is commonly used in the case of sub-micron CMOS.

The issue of different voltage levels becomes particularly acute when trying to match one technology with another due to the different switching levels. TTL technology, for instance, typically operates in the 0 to 3V range (VDD=3V) and has a VIH of 2V±10% and a VIL of 0.8V±10%. Thus TTL will see a voltage of ≧2V as a high and ≦0.8V as a low. In contrast 3.3V LVCMOS logic will switch at different voltages depending on the process used. In the case of 0.18$\mu$ technology, VDD=1.8V±10%, VIH=0.65VDD=1.05 V (0.65 ×lowest VDD=0.65×1.62V), VW=0.35VDD=0.69V (0.35×highest VDD=0.35×1.98). For 0.15$\mu$ technology, VDD=1.5V±10%, VIH=0.65 VDD, VIL=0.35 VDD.

In addition, the issue of 5V tolerant and back-drive protection has to be addressed. This may be illustrated by considering a simple circuit such as the one illustrated in FIG. 2, in which a receiver input comprises a PMOS transistor 200 and NMOS transistor 202 using 0.18$\mu$ technology, and connected to a pad 204 through an NMOS isolation transistor 206. The issue that arises is ensuring that PMOS 200 switches on correctly. With the gate voltage of transistor 206 at 3.3V±10%, the source voltage can be in the range of 2.5V to 3.1V, which, with 3V on the source of transistor 200, is not high enough to ensure that transistor 200 switches off.

Clearly, any solution addressing compatibility issues should ideally also be able to deal with stress mode conditions (5V tolerant mode and back-drive mode).

An IC may typically be operated in one of three modes: (a) Normal mode, in which the core is powered up and drives the pads; (b) 5V tolerant mode, which is a stress mode in which the pads are raised to about 5.5 V, while the core and I/O interface are powered up (VDD and VDDIO are high); (c) Back-drive mode, which is a stress mode in which the pads are raised to about 5.5 V, while the core and I/O interface are powered down (VDD and VDDIO are low). Thus back-drive refers to the 5.5 V tolerant interface when there are no power supplies asserted. This condition becomes particularly important in the case of sub-micron CMOS, dual gate process technology in which the oxide breakdown and drain-source junction breakdown is about 3.8 V. Back-drive I/Os have to tolerate 5.5 V at the pads with and without power supplies asserted (commonly referred to as 5V tolerant level due to the 5V±10% tolerance). However, under stress mode, sub-micron dual gate devices tend to experience problems such as oxide breakdown, drain-source junction breakdown, current flow to VDDIO, and well charging due to the parasitic internal diode structure of CMOS devices.

In order to avoid gate oxide breakdown the voltage drop from drain to gate must not exceed 3.8 V. Similarly, to avoid junction breakdown, the voltage drop from drain to source must not exceed 3.8 V. Furthermore, it is necessary to isolate the receiver input circuitry from the pad under these stress modes.

The present invention seeks to provide a method and circuitry for protecting a receiver circuit under stress mode conditions and of ensuring proper switching of transistors implemented using different technologies and processes.

SUMMARY OF THE INVENTION

The present invention provides an input clamp circuit for providing stress mode protection of I/O receivers. Furthermore, the present invention provides a technique for enhancing the tolerance of a receiver input interface during 5V tolerant and back-drive mode, while allowing a LVTTL logic threshold and interface.

According to the invention there is provided circuitry to limit the potential difference across the CMOS transistors to avoid oxide breakdown and drain-source junction breakdown. In particular the invention provides for a bias circuit supplied by a high external voltage, such as the pad voltage, to charge up the floating wells and floating nodes in order to limit the static DC bias potential below the maximum stress level of the CMOS process. Preferably the resultant circuit comprising the receiver input with its bias circuit is not only 5 V tolerant, but is also back-drive tolerant. Typically the worst case DC current used by this clamp circuit is less than 5 $\mu$A.

The invention provides for a pass gate between the pad and the receiver input interface circuitry to isolate the receiver input circuitry from the pad voltage during stress mode. The pass gate typically includes a PMOS transistor connected in parallel with an NMOS transistor. The PMOS transistor is typically switched off during stress mode while the NMOS transistor provides a reduced voltage to the receiver input. Preferably the gate of the NMOS transistor is charged to a voltage NG1 of approximately 3 V or VDDIO.

According to the invention, there is provided a method of protecting a receiver input during back-drive mode, comprising charging up the floating nodes during back-drive mode, to the level of the supply voltage to limit the voltage across the drain-source junction and across the gate-active node junction of all transistors to below the junction breakdown and gate oxide breakdown voltage levels.

Further, according to the invention, there is provided a method of protecting a receiver input during stress mode, comprising providing a full pass gate between the receiver input and a pad, and, during 5V tolerant and back-drive modes, charging up the gate of the PMOS transistor of the pass gate to shut it off and clamp the voltage to the receiver input at the supply voltage level.

Further, according to the invention, there is provided a method of ensuring proper functioning of the I/O receiver during normal mode, and stress mode in which the pad is exposed to a high voltage, while providing a LVTTL interface, comprising providing a pass gate with a NMOS and a PMOS transistor in parallel, between the pad and the receiver input, and selectively charging the gate of the PMOS transistor to the pad voltage during stress mode. The charging may be performed by means of a charging circuit connected to the pad.

Still further, according to the invention, there is provided a method of protecting an receiver input during stress mode, comprising providing a NMOS transistor between a high voltage pad and the receiver input to limit the voltage to the receiver input under stress mode, providing a PMOS transistor in parallel with the NMOS transistor, and controlling the PMOS to switch on during normal mode and switch off during stress mode. The method preferably includes clamping input voltage to the receiver input to a voltage that avoids gate oxide and junction breakdown. The clamping may be achieved by providing a clamping circuit that includes a current mirror between the receiver input and ground.

DETAILED DESCRIPTION OF THE INVENTION

Figure 1:
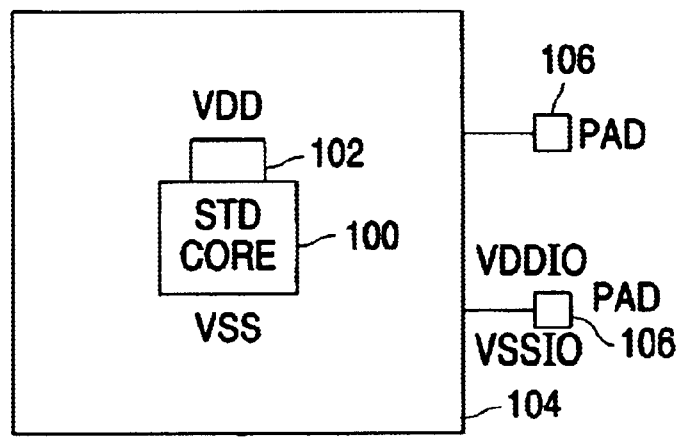
FIG. 1 is a simple representation of a typical prior art integrated circuit device.
Figure 2:
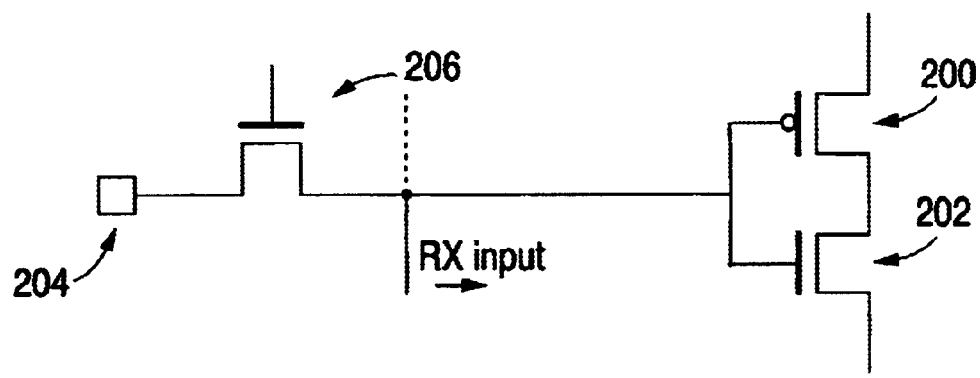
FIG. 2 is a simplified circuit diagram of a receiver circuit connected to a pad.
Figure 3:
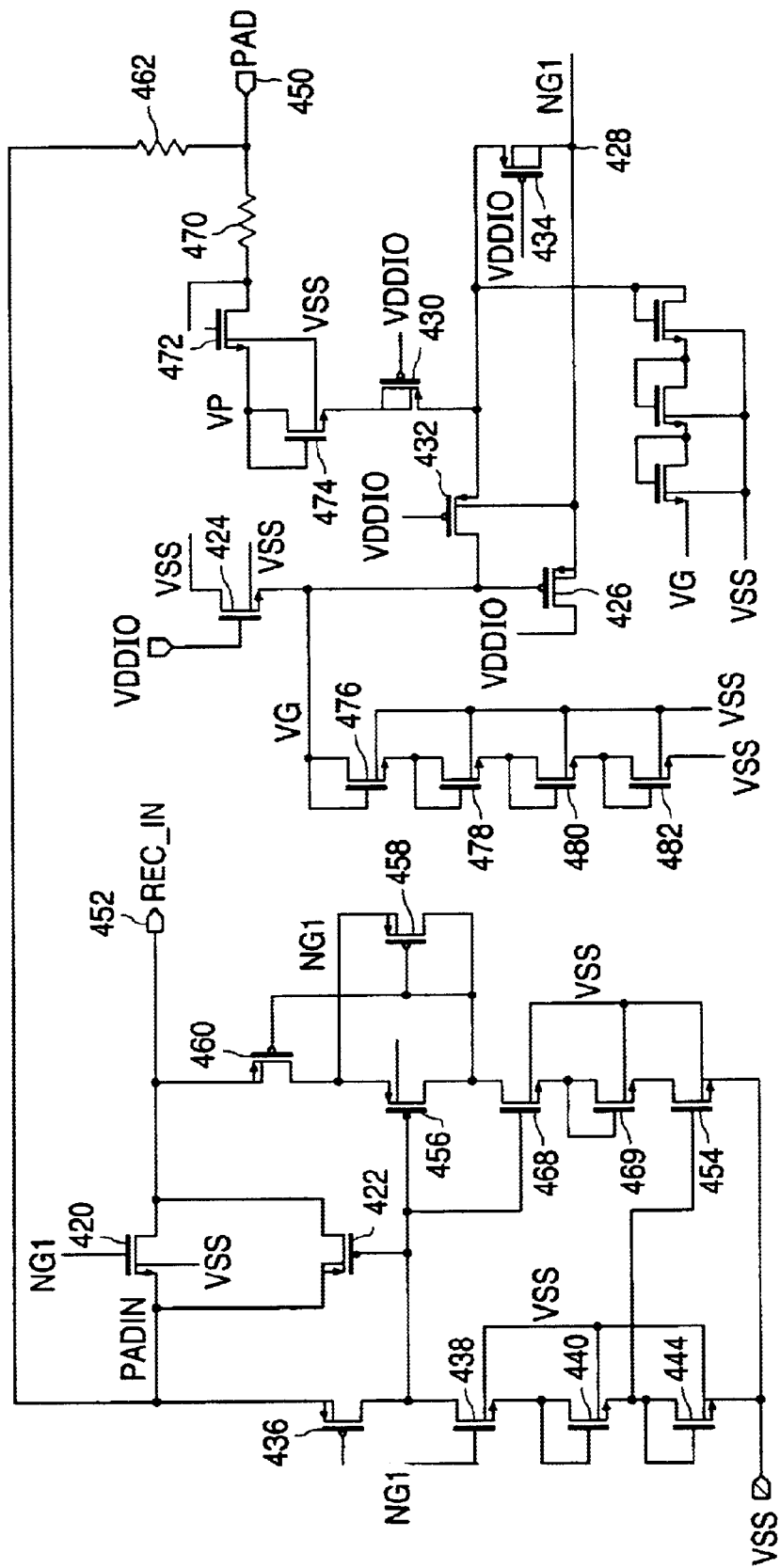
FIG. 3 is a schematic circuit diagram of one embodiment of the invention.

One embodiment of the invention is shown in FIG. 3. The embodiment of FIG. 3 makes use of a full pass gate to isolate the receiver input during stress mode. The pass gate comprises a NMOS transistor 420 and a PMOS transistor 422. As is discussed in greater detail below, the PMOS transistor 422 is off during stress mode but on during normal mode. Thus, it compensates for the diode drop across the NMOS transistor 420 during normal mode. On the other hand, as discussed further below, during stress mode, when PMOS transistor 422 is off, the input to the receiver REC_IN is kept at NG1, which lies between 3V and 3.6V.

During normal mode, NMOS transistor 424 turns on to set the gate of PMOS transistor 426 to the ground level. This causes NG1 at the node 428 to charge to VDDIO through transistor 426. With VDDIO at their gates, PMOS transistors 430, 432, 434, turn off.

PMOS transistor 436 also turns off since its gate is at NG1=VDDIO and the pad voltage cannot be higher than VDDIO. As a result, the gate of pass gate transistor 422 is less than 2Vtn, since transistors 440, 444 limit the gate of transistor 422 to 2Vtn. Therefore transistor 422 is on and passes the voltage at the pad 450 to the REC_IN node of the receiver input during normal mode. Transistor 454 of the current mirror (transistors 444, 454), like transistor 444, is turned off. Also, transistor 456 is on (having less than 2Vtn at its gate), causing the gate and source of PMOS transistor 460 to be at the same potential and turning it off. Thus, transistor 460 has no effect on the REC_IN node 452.

In this embodiment the gate of transistor 468 is connected to the same node that controls the gate of PMOS pass gate transistor. This has an advantage during normal mode, since this node is limited to less than 2Vtn under normal mode. This shuts off transistor 468 during normal mode, thereby ensuring that there is no current flow through this branch of the current mirror even if there are noise glitches. In contrast, in the embodiment of FIG. 6 (discussed below) the transistor 468 is always on, therefore noise glitches on VSS could be passed through to the receiver input REC_IN.

Under 5 V tolerant mode the pad 450 is raised to 5.5 V, while the supplies (both VDD and VDDIO) are asserted. As in the case of normal mode, transistor 426 of the bias circuit charges NG1 to VDDIO=3.3 V. Transistors 430, 432, 434 are again turned off.

By setting NG1 to VDDIO it ensures that the maximum gate oxide and source/drain junction voltages of transistors 436, 438 are not exceeded. Also, with the sources of transistors 456, 458, and the drain of transistor 460 at NG1, and the drain of PMOS 458 at NG1–Vtp (as discussed further below), the gate oxide and junction voltages of these transistors are also not exceeded.

REC_IN node 452 is protected from voltages from the pad 450 by NMOS transistor 420 of the pass gate. (PMOS transistor 422 is switched off since transistor 436 is on and passes the high voltage from the pad 450 through to the gate of transistor 422. Furthermore, with the gate of transistor 420 at NG1, the gate oxide and junction voltages of transistor 420 are not exceeded. Also, the gate oxide and junction voltages of PMOS transistor 422 are not exceeded since its gate charges to 5.5 V through transistor 436, which is the same as its source.

The current mirror (transistors 444, 454) of the clamp circuit is biased by the current that flows through the transistor 436, 438, which are both on due to NG1 on their gates. (Transistors 440 simply acts as a diode). The current mirror devices are designed to burn 1 µA of current worst case. Due to the current mirror, the current is forced through PMOS transistor 458, causing its drain to be at one diode drop below NG1, and, in turn, causes transistor 460 to turn on and clamp the REC_IN voltage at NG1=VDDIO.

Thus the present embodiment provides for a full pass gate and a bias circuit to set the internal node and floating n-well voltages to protect them during 5 V tolerant mode.

During back-drive mode the supplies are not asserted and the pad 450 is raised to 5.5 V. In this mode the bias circuit for NG1 takes its biasing current from the pad itself (in contrast to 5V tolerant mode, which took the biasing current from VDDIO). The bias current passes through the resistor 470 and diode connected transistors 472, 474, which serve to reduce the voltage to about 3V. Since VDDIO is at 0 V in this mode, transistors 430, 434 are switched on, which charges NG1 to about 3 V. With transistor 432 turned on, the gate of transistor 426 goes high, switching transistor 426 off. A current path is provided by transistors 476, 478, 480, 482 to protect transistor 426, since the VG node is now at about 3

V. Also, transistor 424 is turned off. Hence there is no current path to VDDIO.

The receiver input node 452 (REC_IN) is connected to the pad 450 through the resistor 462 (which acts as a junction protection device), and full pass gate transistors 420, 422. The gate of transistor 420 is at NG1 to protect it against high pad voltages, since its gate oxide and drain-source junction voltages are below the 3.8 V limit. Also, as in 5V tolerant mode, the gate of PMOS transistor 422 charges up to 5.5 V through transistor 436. This causes PMOS pass gate transistor 422 to turn off while maintaining its gate oxide and junction voltages below the 3.8V allowable limit.

As in the case of 5V tolerant mode, the current mirror (transistors 444, 454) of the clamp circuit is biased by the current that flows through the transistor 436, 438, which are both on due to NG1 on their gates. (Transistors 440 simply acts as a diode). The current mirror devices are designed to burn 1 µA of current worst case. Due to the current mirror, the current is forced through PMOS transistor 458, causing its drain to be at one diode drop below NG1, and, in turn, causes transistor 460 to turn on and clamp the REC_IN voltage at NG1.

Figure 4:
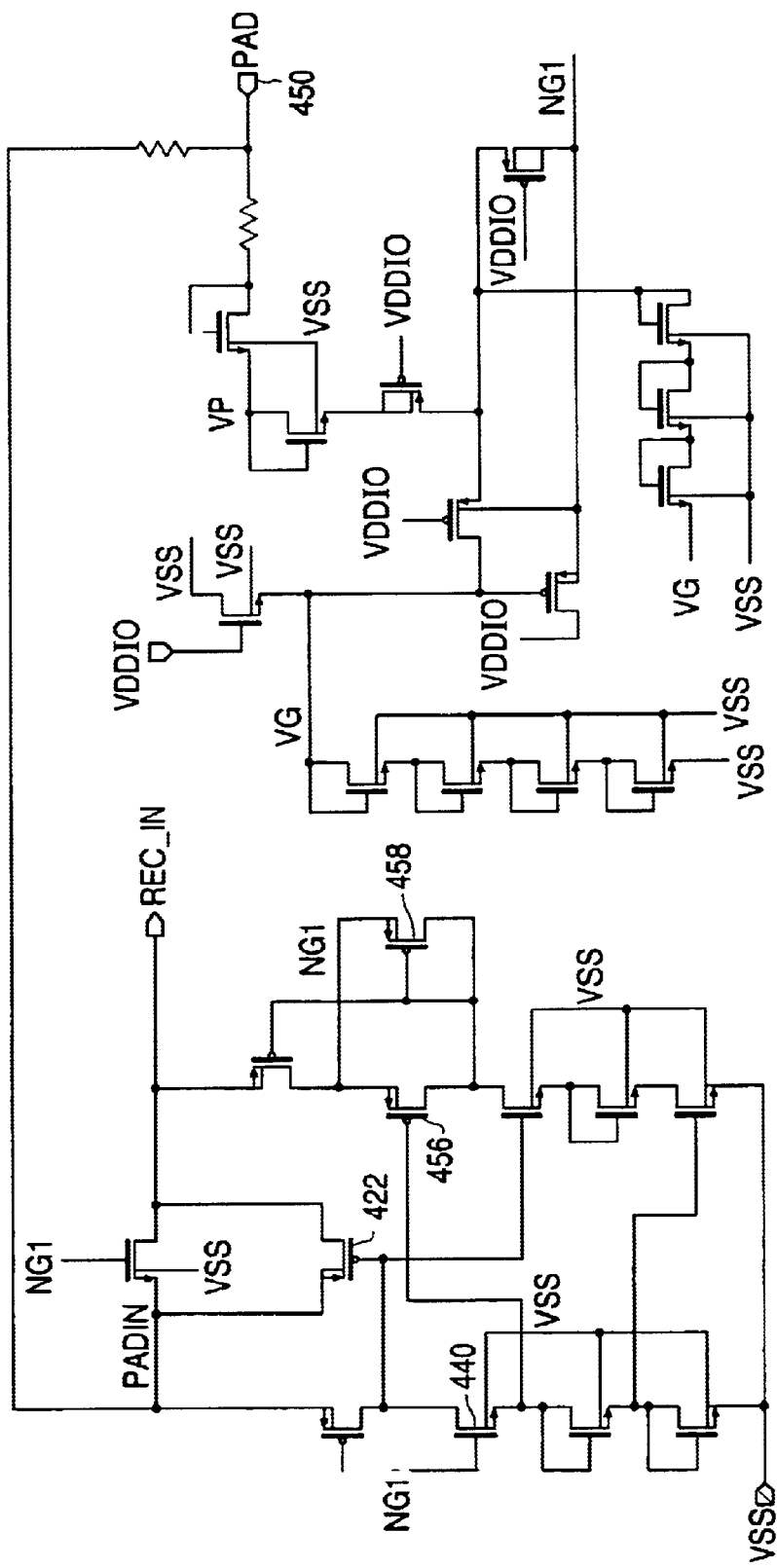
FIG. 4 is a schematic circuit diagram of another embodiment of the invention.

FIG. 4 shows another embodiment of the invention that is similar to that of FIG. 3. The same reference numerals are therefore used to depict similar components. In this embodiment, however, the gate of transistor 456 is controlled by a connection to the source of transistor 440 instead of from the same node that controls the gate of PMOS pass gate transistor 422. While this embodiment functions in substantially the same manner, the embodiment of FIG. 3 has some advantages. In the embodiment of FIG. 3, during stress mode, transistor 456 is turned off, thereby ensuring that all current flows through transistor 458. Thus, a lower current will suffice to ensure the VTP voltage drop across transistor 458.

Figure 5:
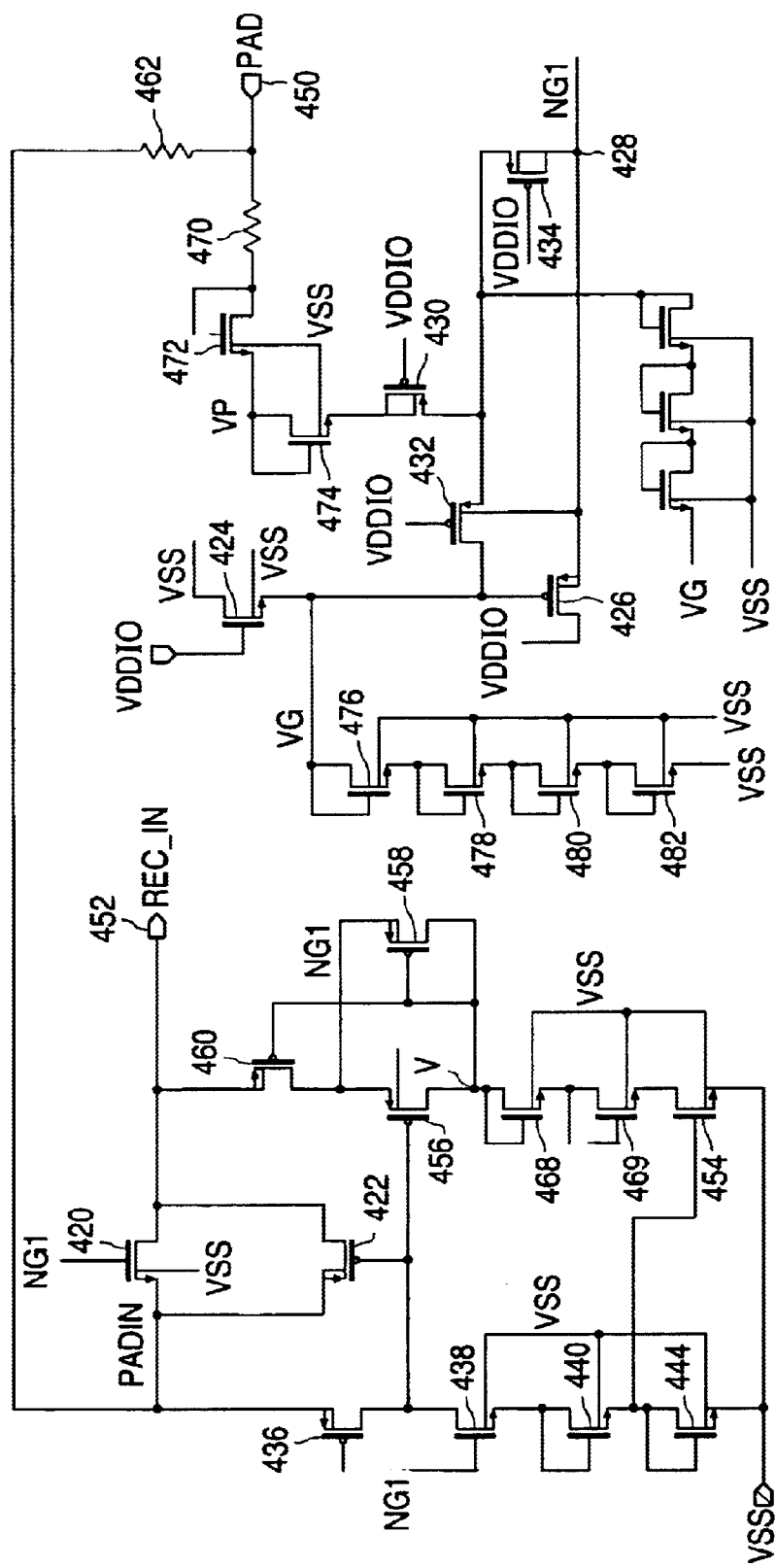
FIG. 5 is a schematic circuit diagram of yet another embodiment of the invention.

Yet another embodiment of the invention, is shown in FIG. 5. Again, for ease of understanding, the same reference numerals are used for similar components. In this embodiment the gate of PMOS 456 is connected to the same node as the gate of PMOS pass gate 422. During stress mode (5V tolerant and back-drive) it is important not to exceed the allowable gate oxide breakdown voltage on any of the transistors. The embodiment of FIG. 5 satisfies this requirement. During stress mode, the gate of the PMOS transistor 456 is at 5.5 V, therefore the drain may not be lower than 1.7 V. The stack comprising NMOS 454 and the two diodes 468, 469 guarantees that the drain of PMOS 456 is above 1.7 V, thereby satisfying the stress limit. Furthermore the embodiment of FIG. 5, like the embodiment of FIG. 3, has the advantage that during stress mode, transistor 456 is turned off, thereby ensuring that all current flows through transistor 458. Thus, a lower current will suffice to ensure the VTP voltage drop across transistor 458.

However, unlike the embodiment of FIG. 3, it has the disadvantage that transistor 468 is always on, therefore noise glitches on VSS could be passed through to the receiver input REC_IN.

Figure 6:
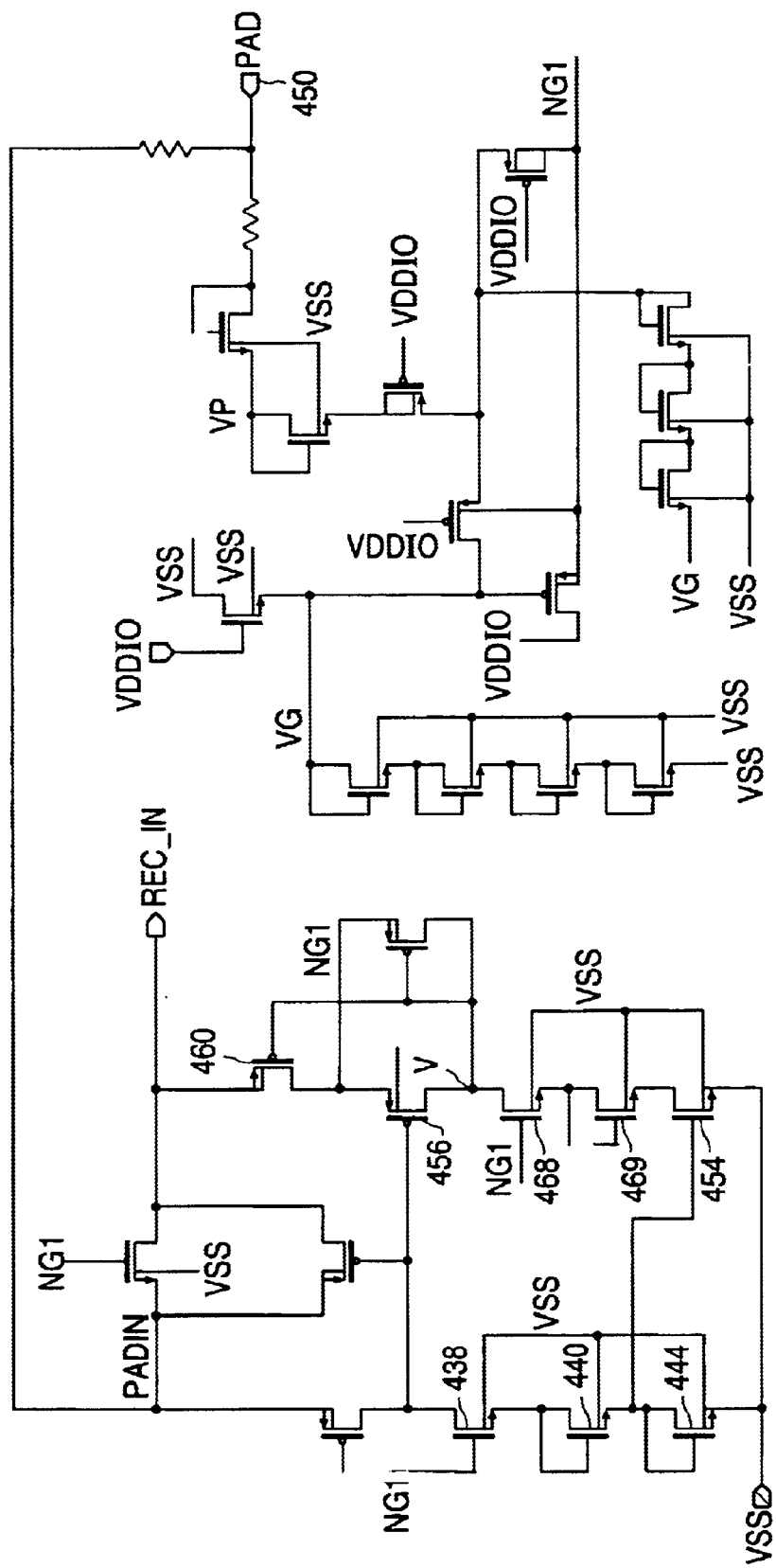
FIG. 6 is a schematic circuit diagram of yet another embodiment of the invention.

Yet another embodiment of the invention, is shown in FIG. 6. Again, for ease of understanding, the same reference numerals are used for similar components. In this embodiment NG1 is applied to the gate of NMOS 468. This changes the configuration of NMOS 468 from a diode (as in the embodiment of FIG. 5) to a transistor. The change in configuration of the NMOS 468 results in a smaller voltage drop across transistor 468 and also guarantees better matching between transistors 438, 440, 444, and transistors 468, 469, 454.

The drain of PMOS 456 is still at NG1-VTP, which is well above the 1.7 V (5.5V–3.8V) needed to avoid oxide breakdown.

Again, however, unlike the embodiment of FIG. 3, the FIG. 6 embodiment has the disadvantage that transistor 468 is always on, therefore noise glitches on VSS could be passed through to the receiver input REC_IN.

It will therefore be appreciated that variations to the invention can be devised, without departing from the scope of the invention, but which may have different advantages. Thus, while the invention was described with respect to specific embodiments, it will be appreciated that the invention could be implemented in different ways without departing from the scope of the claimed invention.

What is claimed is:

1. A receiver input back-drive protection circuit, comprising
   a pass gate between a pad and the receiver input,
   a bias circuit supplied by a high external pad voltage, wherein the bias circuit serves to control the pass gate during back-drive mode, and
   a clamp for the receiver input for clamping the receiver input voltage to the level of a supply voltage.

2. A circuit of claim 1, wherein the pass gate includes a PMOS transistor connected in parallel with a NMOS transistor.

3. A circuit of claim 2, wherein the PMOS transistor is switched off during back-drive mode.

4. A circuit of claim 3, wherein the gate of the NMOS transistor is charged to a voltage of approximately 3 V to ensure, in conjunction with the clamp, a low voltage to the receiver input under back-drive mode.

5. A method of ensuring proper functioning of a receiver input during normal mode, and stress mode in which the pad is exposed to a high voltage, comprising
   providing a pass gate with a NMOS and a PMOS transistor in parallel, between the pad and the receiver input,
   selectively charging the gate of the PMOS transistor up to the pad voltage during stress mode, and
   clamping the input voltage to the receiver input to a voltage that avoids gate oxide and junction breakdown of the receiver input.

6. A method of claim 6, wherein the receiver input has a LVTTL logic interface.

7. A method of claim 5, wherein the clamping clamps the receiver input to the level of a the supply voltage.

8. A method of protecting an receiver input during stress mode, comprising
   providing a NMOS transistor between a high voltage pad and the receiver input to limit the voltage to the receiver input under stress mode,
   providing a PMOS transistor in parallel with the NMOS transistor,
   controlling the PMOS to switch on during normal mode and switch off during stress mode, and
   clamping the input voltage to the receiver input to a voltage that avoids gate oxide and junction breakdown of the receiver input.

9. A method of claim 8, wherein the clamping is achieved by providing a clamping circuit that includes a current mirror between the receiver input and ground.

10. A method of protecting a receiver input during stress mode, comprising
    providing a full pass gate between the receiver input and a pad,
    during mode, charging up the gate of the PMOS transistor of the pass gate to shut it off, and
    clamping the voltage to the receiver input at a supply voltage level.

* * * * *